United States Patent
Sriramagiri et al.

(10) Patent No.: US 9,524,771 B2
(45) Date of Patent: *Dec. 20, 2016

(54) DRAM SUB-ARRAY LEVEL AUTONOMIC REFRESH MEMORY CONTROLLER OPTIMIZATION

(71) Applicant: QUALCOMM Incorporated, San Diego, CA (US)

(72) Inventors: Deepti Vijayalakshmi Sriramagiri, San Diego, CA (US); Jungwon Suh, San Diego, CA (US); Xiangyu Dong, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 75 days.

This patent is subject to a terminal disclaimer.

(21) Appl. No.: 14/148,515

(22) Filed: Jan. 6, 2014

(65) Prior Publication Data

US 2015/0016203 A1  Jan. 15, 2015

Related U.S. Application Data

(60) Provisional application No. 61/845,818, filed on Jul. 12, 2013.

(51) Int. Cl.
 *G11C 11/406* (2006.01)
 *G06F 13/16* (2006.01)

(52) U.S. Cl.
 CPC ..... *G11C 11/40618* (2013.01); *G06F 13/1636* (2013.01); *G11C 11/40603* (2013.01); *G11C 11/40611* (2013.01)

(58) Field of Classification Search
 CPC ............ G11C 11/40618; G11C 11/40603; G11C 11/40611
 USPC .................................. 365/222, 194, 236
 See application file for complete search history.

(56) References Cited

U.S. PATENT DOCUMENTS

| | | | |
|---|---|---|---|
| 6,711,083 B2 | 3/2004 | Demone | |
| 7,755,967 B2 * | 7/2010 | Kunce et al. | 365/222 |
| 8,310,893 B2 * | 11/2012 | Luthra et al. | 365/222 |
| 8,982,654 B2 | 3/2015 | Dong et al. | |
| 2001/0040833 A1 | 11/2001 | Bogin et al. | |
| 2003/0067825 A1 | 4/2003 | Shimano et al. | |
| 2004/0228168 A1 * | 11/2004 | Ferrant et al. | 365/154 |
| 2007/0086266 A1 | 4/2007 | Freebern et al. | |
| 2009/0238021 A1 | 9/2009 | Ban et al. | |

(Continued)

FOREIGN PATENT DOCUMENTS

WO   2012074724 A1   6/2012

OTHER PUBLICATIONS

International Search Report and Written Opinion—PCT/US2014/038845—ISA/EPO—Nov. 21, 2014.

(Continued)

*Primary Examiner* — Richard Elms
*Assistant Examiner* — Jerome Leboeuf
(74) *Attorney, Agent, or Firm* — Seyfarth Shaw LLP

(57) ABSTRACT

A method of refreshing a dynamic random access memory (DRAM) includes detecting an open page of the DRAM at a row of a DRAM bank within an open sub-array of the DRAM bank. The method also includes delaying issuance of a refresh command to a target refresh row of the DRAM bank when the target refresh row of the DRAM bank is within the open sub-array of the DRAM bank.

21 Claims, 10 Drawing Sheets

(56) References Cited

U.S. PATENT DOCUMENTS

2011/0141836 A1    6/2011    Luthra et al.
2013/0080694 A1    3/2013    Iyer et al.

OTHER PUBLICATIONS

Ghosh M., et al., "Smart Refresh: An Enhanced Memory Controller Design for Reducing Energy in Conventional and 3D Die•Stacked DRAMs," 40th IEEE/ACM International Symposium on Microarchitecture, 2007, pp. 134-145.
Liu J., et al., "RAIDR: Retention-Aware Intelligent DRAM Refresh," Proceeding ISCA '12 Proceedings of the 39th Annual International Symposium on Computer Architecture, vol. 40 (3), Jun. 2012, pp. 1-12.

\* cited by examiner

DRAM SUB-ARRAY LEVEL AUTONOMIC REFRESH MEMORY CONTROLLER OPTIMIZATION

CROSS REFERENCE TO RELATED APPLICATIONS

The present application claims the benefit of U.S. Provisional Patent Application No. 61/845,818 filed on Jul. 12, 2013, in the names of Deepti V. Sriramagiri et al., the disclosure of which is expressly incorporated by reference herein in its entirety.

TECHNICAL FIELD

The present disclosure generally relates to memory refresh techniques. More specifically, the present disclosure relates to memory architectures and methods to refresh dynamic random access memory (DRAM) arrays.

BACKGROUND

The development of dynamic random access memory (DRAM) arrays with higher density and smaller feature sizes has increased the rate of DRAM refresh operations to compensate for a larger number of leaking memory cells. A higher DRAM refresh rate can impact system performance. For example, DRAM refresh operations can impede performance because all open pages of a memory bank are generally closed before a bank may be refreshed. Moreover, DRAM bank access is generally not allowed during a refresh operation, which further impedes system performance.

SUMMARY

In one aspect of the present disclosure, a method of refreshing a dynamic random access memory (DRAM) is disclosed. The method includes detecting an open page of the DRAM at a row of a DRAM bank within an open sub-array of the DRAM bank. The method also includes delaying issuance of a refresh command to a target refresh row of the DRAM bank when the target refresh row of the DRAM bank is within the open sub-array of the DRAM bank.

Another aspect discloses a memory controller including a dynamic random access memory (DRAM) and a refresh controller coupled to the DRAM with a memory bus. The refresh controller includes a column before row (CBR) counter and control logic. The control logic is operable to detect an open page of the DRAM at a row of a DRAM bank within an open sub-array of the DRAM bank according to a value of the CBR counter. The control logic is also operable to delay issuance of a refresh command to a target refresh row of the DRAM bank when the target refresh row of the DRAM bank is within the open sub-array of the DRAM bank.

In another aspect, a memory controller includes a dynamic random access memory (DRAM) and a refresh controller coupled to the dynamic random access memory. The refresh controller includes a column before row (CBR) counter. The refresh controller includes means for detecting an open page of the DRAM at a row of a DRAM bank within an open sub-array of the DRAM bank according to a value of the CBR counter. The refresh controller also includes means for delaying issuance of a refresh command to a target refresh row of the DRAM bank when the target refresh row of the DRAM bank is within the open sub-array of the DRAM bank.

Another aspect discloses a method of refreshing a dynamic random access memory (DRAM). The method includes the step of detecting an open page of the DRAM at an open row of a DRAM bank within an open sub-array of the DRAM bank. The method also includes the step of delaying issuance of a refresh command to a target refresh row of the DRAM bank when the target refresh row of the DRAM bank is within the open sub-array of the DRAM bank.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts. As described herein, the use of the term "and/or" is intended to represent an "inclusive OR", and the use of the term "or" is intended to represent an "exclusive OR".

Dynamic random access memory (DRAM) scaling continues to increase the total number of bits in each DRAM chip. This increased capacity directly impacts the specification of DRAM refresh operations, the process by which a bit cell's value is kept readable. The specification of DRAM refresh operations includes the interval at which refresh commands are sent to DRAM (tREFI) banks, and the amount of time the refresh command occupies the DRAM interface (tRFC).

Unfortunately, DRAM scaling also increases the number of weak retention cells (e.g., cells that have a lower retention time). Such cells are subject to frequent refresh options to maintain the stored information. Performance and power consumption are significantly impacted by the increased refresh cycles on a DRAM in a system on chip (SoC) or other like computer architecture. Potential DRAM chip yield loss from the increased number of weak retention cells results without the increased refresh cycles.

According to aspects of the present disclosure the detrimental effects of increased dynamic random access memory (DRAM) refresh rates may be mitigated by refreshing sub-arrays in a DRAM bank. In this aspect of the disclosure, refreshing the sub-arrays in a DRAM bank is performed while other sub-arrays in the memory bank are allowed to remain open and while access to the other sub-arrays is allowed. In another aspect of the disclosure, a DRAM memory controller may delay issuance of a refresh command to a target refresh row of a DRAM bank when the target refresh row of the DRAM bank is in an open sub-array of the DRAM bank.

Figure 1:
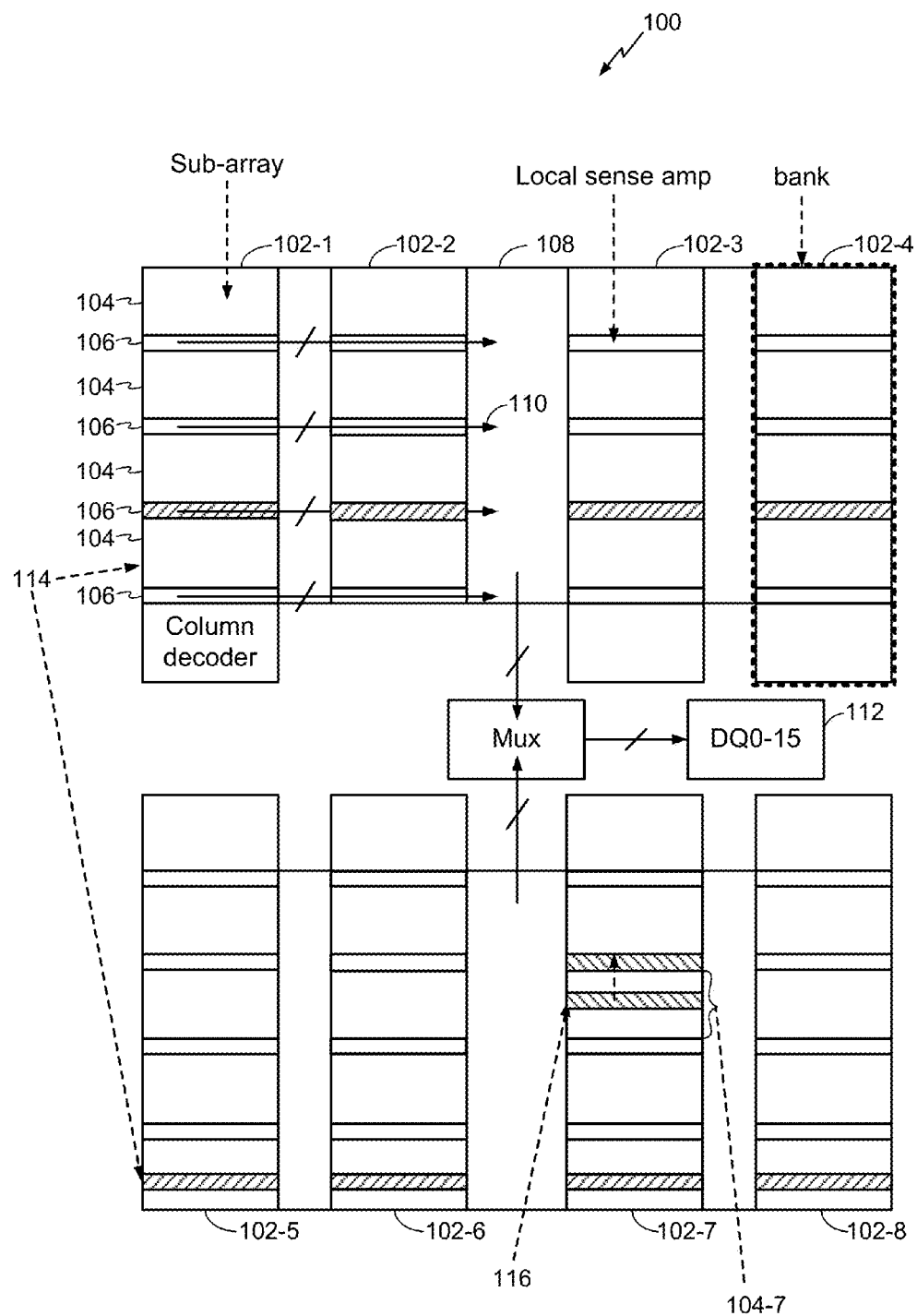
FIG. 1 is a diagram of a conventional DRAM array architecture.

FIG. 1 illustrates a DRAM 100 including eight DRAM banks 102 (102-1, . . . , 102-8). Each of the DRAM banks 102 includes four DRAM sub-arrays 104. Although FIG. 1 illustrates each bank 102 including four sub-arrays 104, it should be understood that implementations of the present disclosure may generally include 32, 64 or some other number of sub-arrays 104 in each DRAM bank 102. Local sense amplifiers 106 are coupled to the sub-arrays 104. The size of each of the local sense amplifiers 106 corresponds to the DRAM page size. For example, in current implementations, the page size can be up to about four kilobytes (4 KB).

Although FIG. 1 illustrates a simplified case where only one row is refreshed in each refresh cycle, it should be understood that more than one row may be refreshed for each refresh cycle. For example, a DRAM bank may have 32K rows, but the refresh cycle may be implemented as an 8K cycle. In this case, four rows for each bank are refreshed during a refresh cycle (tRFC). These four rows are usually distributed into four sub-arrays. For example, in a DRAM bank having a total of thirty two sub-arrays, while four of the sub-arrays are performing refresh operations, the remaining 28 sub-arrays are free for normal operations. The present description, however, is with respect to one row (one sub-array) being refreshed for each refresh cycle to simplify the explanation.

The local sense amplifiers 106 are coupled to a global input/output (I/O) sense amplifier 108 through a narrower I/O sense amplifier bus 110. In one example, an I/O sense amplifier bus 110 may be 128 bits wide, however it should be understood that the I/O sense amplifier bus 110 may be implemented with different bus widths. In the illustrated example, a DRAM output bus 112 can be 16 bits wide for an 8 ns pre-fetch operation. It should be understood that the DRAM output bus 112 may also be implemented with different bus widths.

Conventionally, to refresh a bank in a DRAM array, the entire bank is first closed and no access is allowed to the bank during the refresh operation. According to aspects of the present disclosure, however, when a particular row (e.g., the refresh row 114, shown in FIG. 1) in each bank 102 is refreshed during an all-bank refresh operation, a bank 102 should not be closed unless the row being refreshed (e.g. the refresh row 114, shown in FIG. 1) is in the same sub-array as an open page. In FIG. 1, for example, an open page 116 is located in a sub-array 104-7 of a bank 102-7. As described herein, the sub-array 104-7 may be referred to as an "open sub-array."

According to aspects of the present disclosure, because the open page 116 is not in the same sub-array (e.g., the open sub-array 104-7) as the row being refreshed (e.g., the refresh row 114), the open page 116 can remain open during the refresh operation. In this case, none of the banks 102 should be closed during the refresh operation. On the other hand, according to aspects of the present disclosure, an entire bank (e.g., bank 102-7) is closed during a refresh operation when a row being refreshed (e.g. the refresh row 114) is in a sub-array (e.g., open sub-array 104-7) of the bank (e.g., bank 102-7) that includes the open page (e.g., open page 116).

Figure 2:
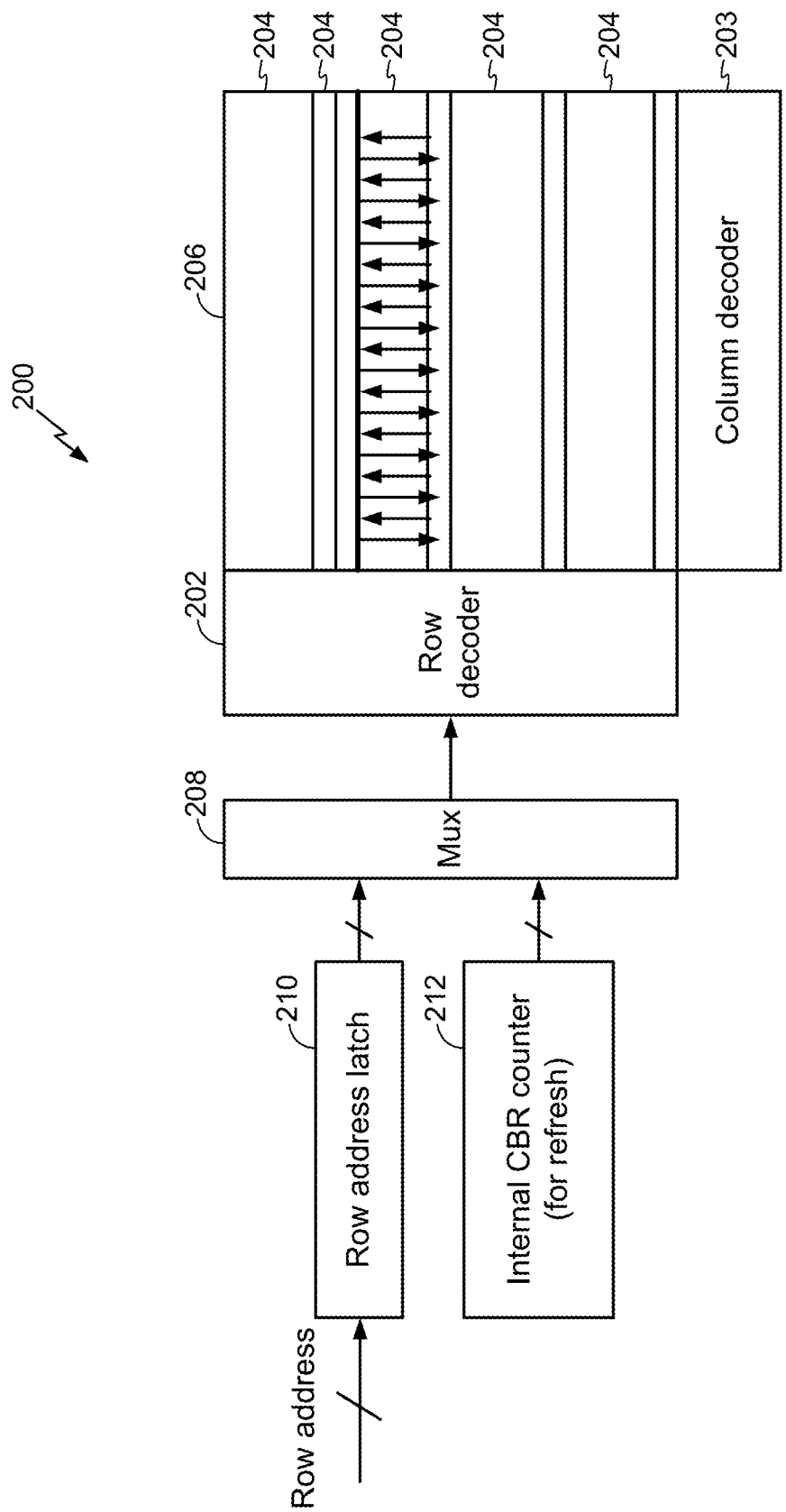
FIG. 2 is a diagram of a DRAM bank in a DRAM array.

Referring to FIG. 2, a DRAM architecture 200 includes a global row decoder 202 and a column decoder 203 coupled to each sub-array 204 in a DRAM bank 206. During normal memory access to the DRAM bank 206, when an activate command is received from a memory controller, a row address provided in the activate command is coupled by multiplexer circuitry 208 from a row address latch 210 to the global row decoder 202.

During a refresh operation, the multiplexer circuitry 208 couples a row address generated by a refresh counter 212 to the global row decoder 202. In this example, the refresh counter 212 is also called an internal column before row (CBR) counter. The refresh counter 212 tracks which row has been refreshed and which row should be refreshed in the next refresh cycle. In the DRAM architecture 200, the refresh counter 212 generally starts at a random address.

The multiplexer circuitry 208 selects either the row address from the row address latch 210 during a normal memory access or the row address from the refresh counter 212 during a refresh operation. In the DRAM architecture 200, only one word line at a time is asserted by the global row decoder 202 based on the row address received from the multiplexer circuitry 208. This prevents other rows in the bank 206 from being accessed, even if a refresh is being performed in a different sub-array 204 within the bank 206.

Aspects of the present disclosure include a DRAM architecture that modifies the DRAM device and the memory controller. Changes to the DRAM device allow multiple word lines to be asserted at the same time.

Figure 3:
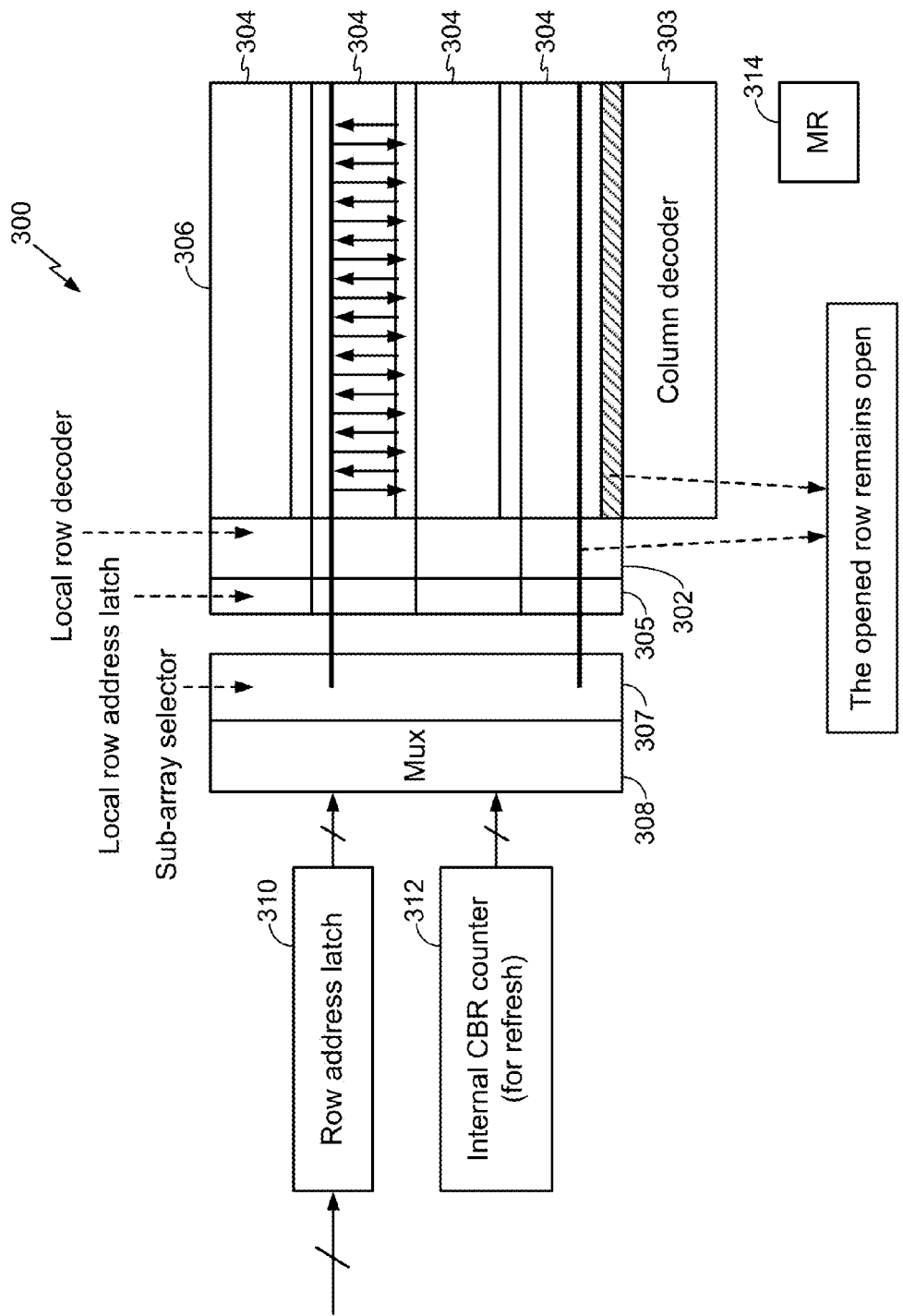
FIG. 3 is a diagram of a DRAM bank according to aspects of the present disclosure.

Referring to FIG. 3, a DRAM architecture 300 according to aspects of the present disclosure allows refresh operations on sub-arrays in a memory bank having open pages in other sub-arrays. The DRAM architecture 300 includes a local row decoder 302 and a column decoder 303 coupled to each sub-array 304 in a DRAM bank 306. A local row address latch 305 is coupled to the local row decoder 302. Multiplexer circuitry 308 coupled to a row address latch 310 and a refresh counter 312 couples row addresses to a sub-array selector 307.

According to aspects of the present disclosure, the global row decoder is replaced by the sub-array selector 307 and the local row decoder 302. This allows multiple (e.g., two) word lines to be fired at the same time to address rows in two separate sub-arrays. For example, one word line can be asserted based on a row address in a first one of the sub-arrays received from the row address latch 310 and, at the same time, another word line can be asserted based on a row address in a second one of the sub-arrays 304 received from the refresh counter 312.

According to aspects of the present disclosure, the refresh counter 312 may be started at 0 and is synchronized with an address controller. This synchronization enables the memory controller to know which row is being refreshed inside the DRAM device so that the memory controller can determine if the normal operation and refresh operation have a sub-array conflict. It may be done by initializing the refresh counter to 0 at the power-up stage and adding a duplicated refresh counter at the memory controller side, which also initialized to 0 at power-up. Both counters will be incremented under the same condition. Although aspects of the present disclosure are described in which the refresh counter behavior is pre-defined, other aspects of the present disclosure include alternative implementations in which a memory controller is configured to explicitly provide an indication of which sub-array only or which sub-array and which row in that sub-array may be refreshed in a next refresh cycle.

According to another aspect of the present disclosure, a mode register 314 is implemented to store and indicate to the memory controller the number of sub-arrays 304 in a DRAM bank 306. This allows the memory controller to determine the number of sub-arrays for each device, which may vary between memory devices that are provided by different vendors, for example.

Aspects of the present disclosure include a DRAM memory controller that is configured to allow access to sub-arrays in a DRAM bank while a row of another sub-array in the DRAM bank is refreshed. A DRAM memory controller protocol engine is adapted to allow READ/WRITE/PRECHARGE commands during a refresh period (tRFC window) and to allow ACTIVATE commands during the tRFC window.

Figure 4:
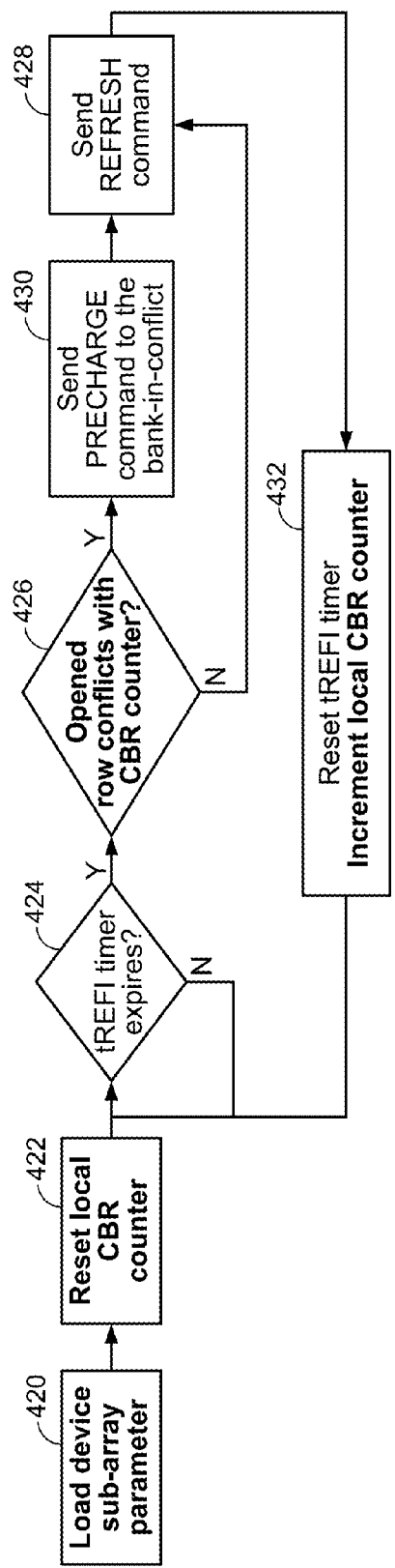
FIG. 4 is a functional block diagram illustrating functions of a DRAM memory controller according to aspects of the present disclosure.

The functionality of a DRAM memory controller according to aspects of the present disclosure is described with reference to FIG. 4. At block 420, the DRAM memory controller loads device sub-array parameters. The device sub-array parameters may include information from the mode register 314 (FIG. 3), for example. At block 422, the DRAM memory controller resets a local refresh (CBR) counter. At block 424, the DRAM memory controller determines whether a tREFI timer, which indicates a refresh period, has expired.

When the tREFI timer has expired, at block 426, the DRAM memory controller determines whether an open row conflicts with the local refresh counter. If no open row conflicts with the local refresh counter, i.e., no rows are open in the sub-array being refreshed, then in block 428, the DRAM memory controller sends a REFRESH command.

If an open row conflicts with the local refresh counter (e.g., a row is open in the sub-array to be refreshed), then in block 430, the DRAM memory controller sends a PRE-CHARGE command to the bank in conflict to close only the bank in which a row of the sub-array being refreshed was open. Then in block 428, the DRAM memory controller sends a REFRESH command. After the REFRESH command is sent, the DRAM memory controller resets the tREFI timer at block 432.

According to one aspect of the present disclosure, the DRAM memory controller only sends the pre-charge command to close a bank in the case of a sub-array conflict. After the refresh command, both the DRAM side counter and the memory controller CBR counter are incremented. This allows an open row in the memory device during the refresh. Improved performance is provided by the open row because conventional DRAM architectures close all open rows before refresh.

According to aspects of the present disclosure, read commands, write commands and pre-charge commands are allowed during the tRFC window when these commands and the refresh are not in the same sub-arrays because sub-array level parallelism is configured. An activation command is also allowed during the tRFC window, with some reasonable current draw limitations, because both the activation command and the refresh command consume a large amount of current. In one configuration, a reasonable timing is imposed between these two operations, but it is possible that the activate command and the refresh command are both issued within the tRFC window.

Although aspects of the present disclosure are described with reference to an architecture and method for refreshing all banks in a memory device during a refresh operation, it should be understood that the various aspects of the present disclosure may also be implemented in other DRAM devices. For example, the various aspects of the present disclosure may also be implemented in DRAM devices that are configured to perform refresh operations on a per-bank basis in which a bank address is used to identify the bank that is being refreshed.

In a further aspect of the disclosure, sub-array level parallelism may not be available when a refresh command is issued to a target refresh row of the DRAM bank. For example, sub-array level parallelism is not available when a refresh command is issued to a target refresh row that is in an open sub-array of the DRAM bank. In this aspect of the disclosure, a DRAM memory controller may delay issuance of a refresh command to a target refresh row of the DRAM bank when the target refresh row of the DRAM bank is in an open sub-array of the DRAM bank. In one configuration, the DRAM memory controller skips the refresh command to the target refresh row. In another configuration, delayed refresh commands are issued by the DRAM memory controller when a memory bus is idle, for example, as shown in FIG. 5.

Figure 5:
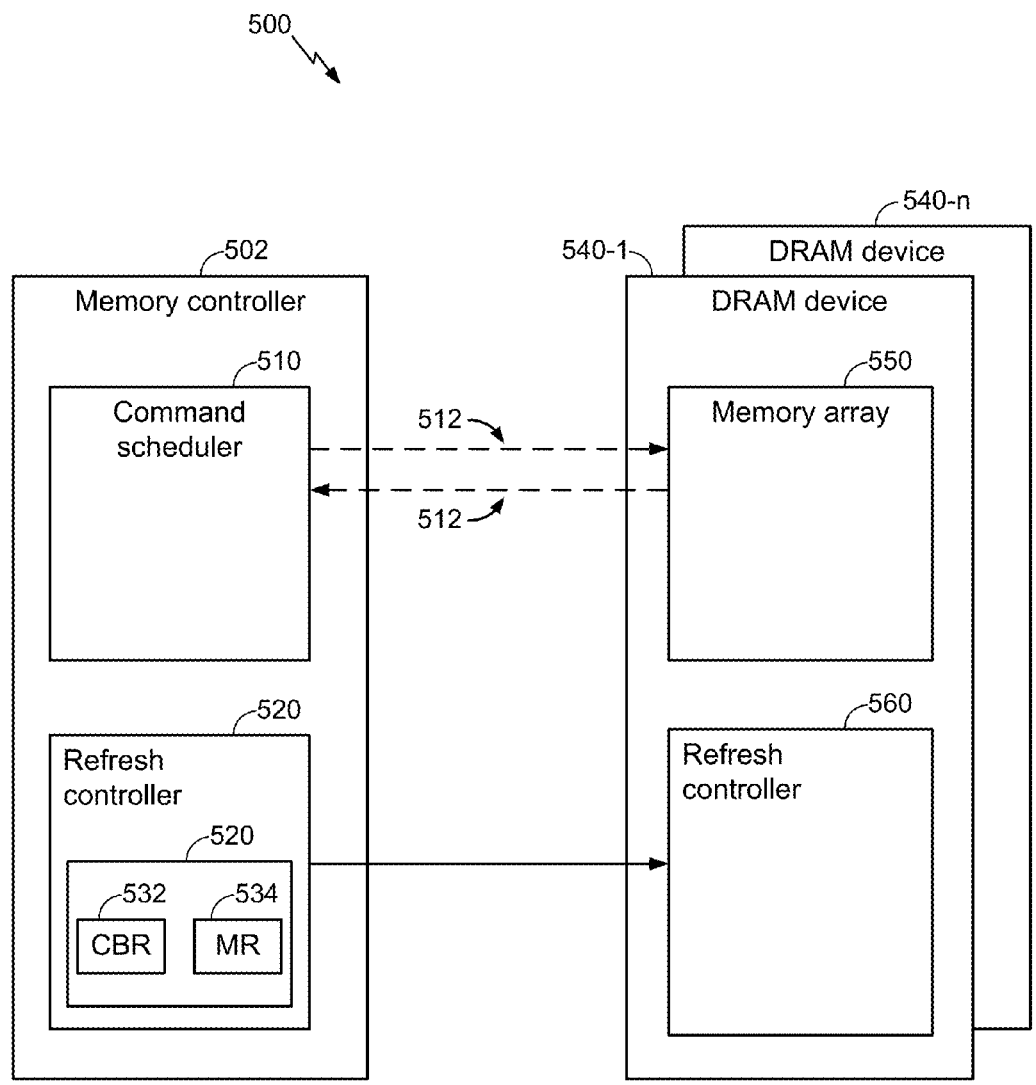
FIG. 5 is a block diagram illustrating a DRAM memory controller including a command scheduler and a refresh scheduler to delay refresh operations when sub-array level conflicts are detected, according to another aspect of the present disclosure.

FIG. 5 is a block diagram 500 illustrating a DRAM memory controller 502 including a command scheduler 510 and a refresh controller 520 to delay issuance of refresh operations when sub-array level conflicts are detected, according to one aspect of the present disclosure. In this configuration, a memory bus 512 couples the memory controller 502 to DRAM devices 540 (540-1, ..., 540-n), each including a memory array 550 and a refresh counter 560. The refresh controller 520 issues refresh commands at a refresh interval (tREFI). In this configuration, the refresh controller 520 includes refresh control logic 530 having a column before row (CBR) counter 532 and a mode register (MR) 534. In this example, the column before row (CBR) counter 532 tracks which sub-array has been refreshed and which sub-array should be refreshed in the next refresh cycle. The mode register (MR) 534 provides the number of sub-arrays in a DRAM bank. In operation, the refresh control logic 530 in combination with the column before row (CBR) counter 532 and the mode register (MR) 534 delay issuance of refresh commands to target refresh rows of the DRAM bank when a target refresh row of the DRAM bank is in an open sub-array of the DRAM bank, as further illustrated in FIG. 6.

Figure 6:
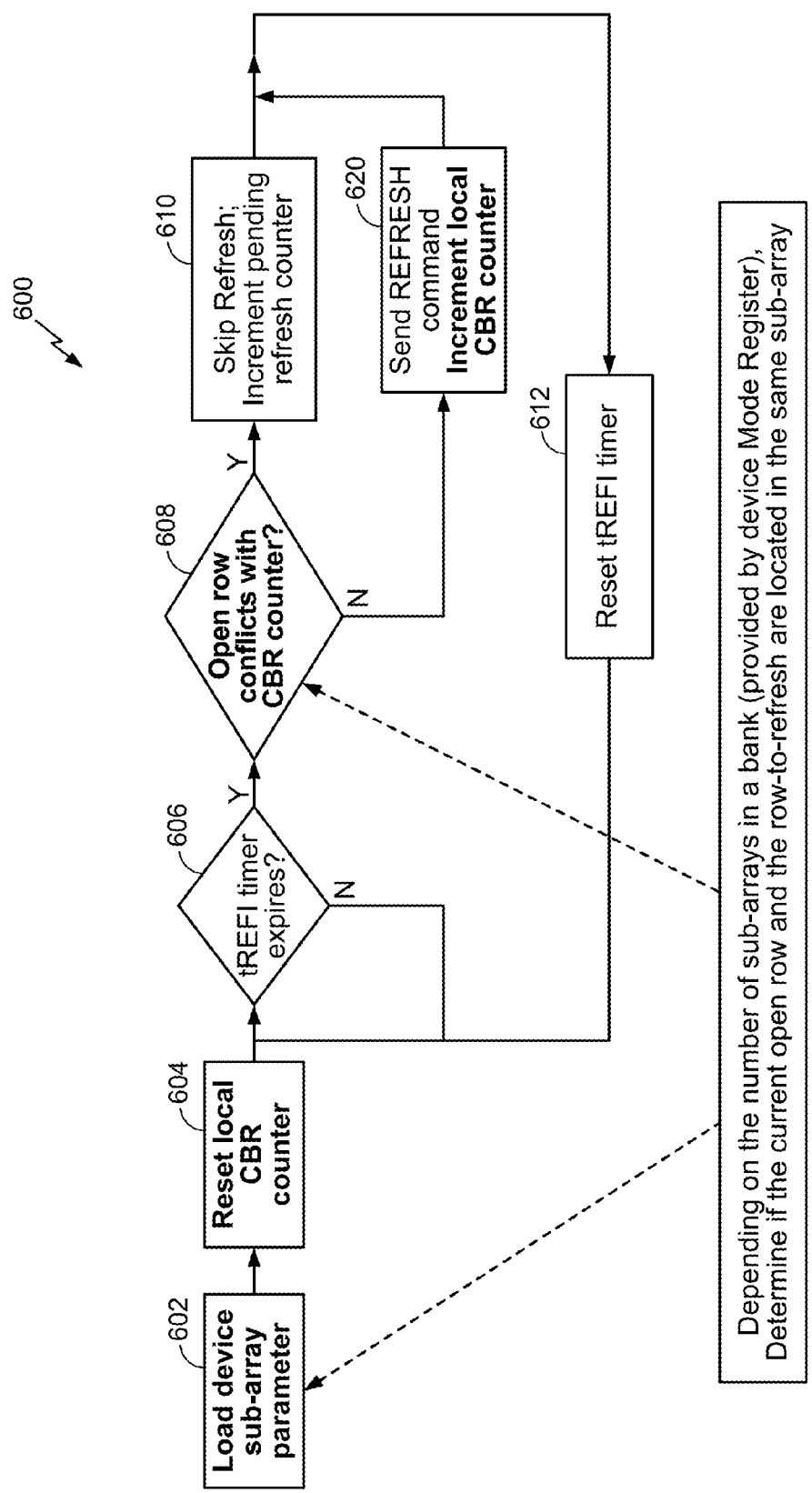
FIG. 6 is a functional block diagram illustrating functions of the DRAM memory controller of FIG. 5 according to one aspect of the present disclosure.

FIG. 6 is a functional block diagram 600 illustrating functions of the DRAM memory controller of FIG. 5, according to another aspect of the present disclosure. At block 602, the DRAM memory controller 502 loads device sub-array parameters. The device sub-array parameters may include information from the mode register 534. For example, the operation of blocks 602 and 608 may depend on the number of sub-arrays in a bank, which is provided by the device mode register 534. At block 604, the DRAM memory controller 502 resets the local column before row (CBR) counter 532. At block 606, the DRAM memory controller 502 determines whether a tREFI timer, which corresponds to a refresh period, has expired. When the tREFI timer has expired, at block 608, the DRAM memory controller 502 determines whether an open sub-array conflicts with a target refresh row indicated by the column before row (CBR) counter 532. In this configuration, blocks 602 and 608 determine if the current open row and the row-to-refresh are located at the same sub-array.

When no open sub-array conflicts with the target refresh row indicated by the column before row (CBR) counter 532 (e.g., no rows are open in the sub-array being refreshed), in block 620, the DRAM memory controller 502 sends a REFRESH command and increments the column before row (CBR) counter 532. When an open sub-array conflicts with the column before row (CBR) counter 532 (e.g., a row is open in the sub-array to be refreshed), in block 610, the DRAM memory controller 502 skips the REFRESH command and updates the pending refresh counter. After the REFRESH command is sent (block 620) or the REFRESH command is skipped (block 610), the DRAM memory controller 502 resets the tREFI timer at block 612, after which control flow returns to block 606. In one example, a maximum of eight REFRESH commands may be postponed, for example, as shown in FIG. 7.

Figure 7:
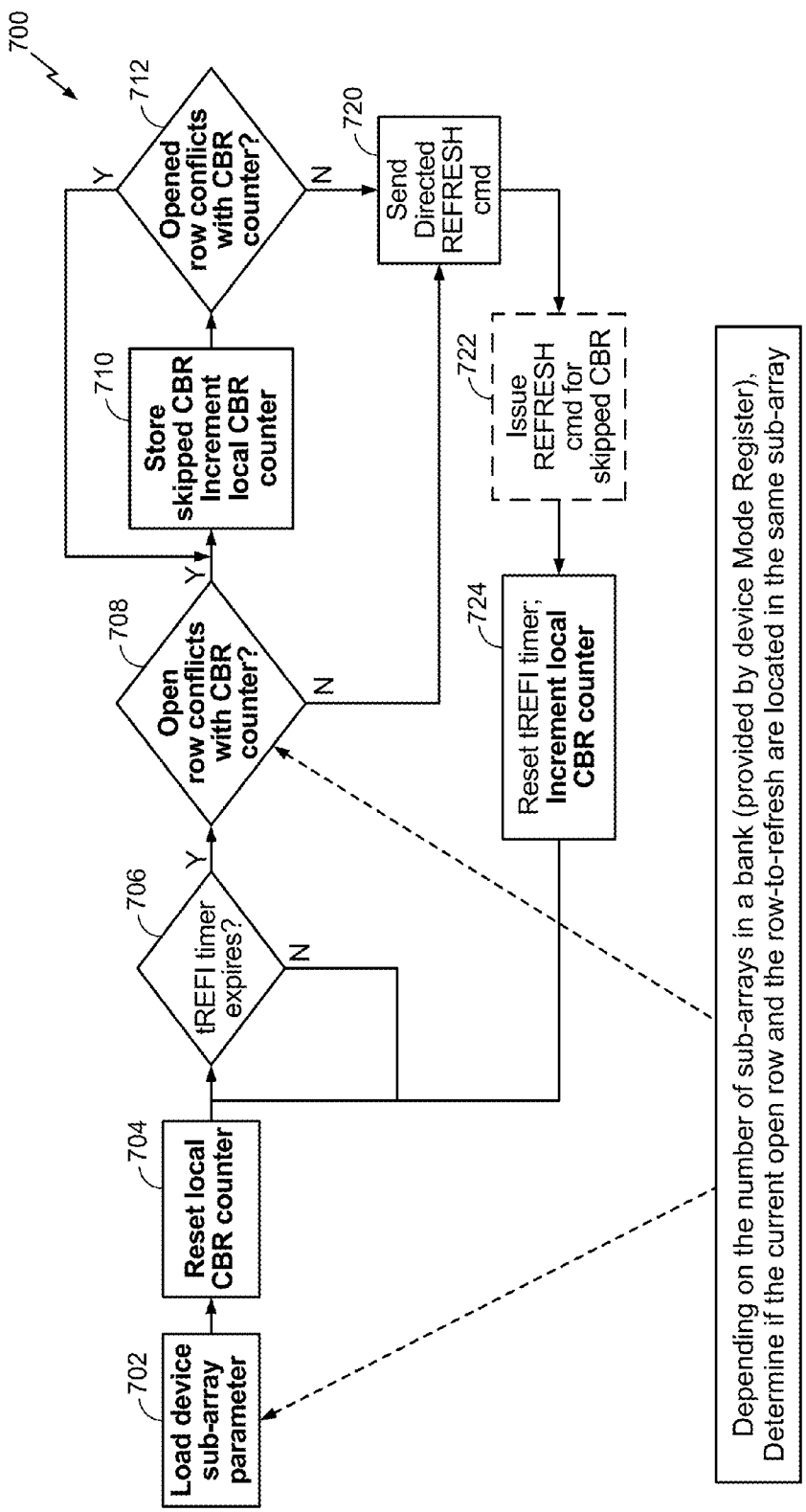
FIG. 7 is a functional block diagram illustrating functions of the DRAM memory controller of FIG. 5 according to another aspect of the present disclosure.

FIG. 7 is a functional block diagram 700 illustrating functions of the DRAM memory controller of FIG. 5 according to another aspect of the present disclosure. At block 702, the DRAM memory controller 502 loads device sub-array parameters (e.g., from the mode register 534). For example, the operation of blocks 702 and 708 may depend on the number of sub-arrays in a bank, which is provided by the device mode register 534. At block 704, the DRAM memory controller 502 resets the column before row (CBR) counter 532. At block 706, the DRAM memory controller 502 determines whether a tREFI timer, which corresponds to a refresh period, has expired. When the tREFI timer has expired, at block 706, block 708 is performed to determine whether a sub-array conflict exists.

In this configuration, blocks 702 and 708 determine if the current open row and the row-to-refresh are located at the same sub-array. In particular, when the tREFI timer has expired, at block 708, the DRAM memory controller 502 determines whether an open sub-array conflicts with a target refresh row indicated by the column before row (CBR) counter 532. When no open sub-array conflicts with target refresh row indicated by the column before row (CBR) counter 532 (e.g., no rows are open in the sub-array being refreshed), in block 720, the DRAM memory controller 502 sends a directed REFRESH command. When an open sub-array conflicts with the local CBR counter (e.g., a row is open in the sub-array to be refreshed), in block 710, the DRAM memory controller 502 stores the skipped REFRESH command and updates the column before row (CBR) counter 532.

As shown in FIG. 7, at block 712, the DRAM memory controller 502 determines whether an open sub-array conflicts with a next target refresh row indicated by the column before row (CBR) counter 532. When no sub-array row conflicts with the next target refresh row indicated by the column before row (CBR) counter 532, in block 720, the DRAM memory controller 502 sends a directed REFRESH command. Otherwise, control flow returns to block 710. After the directed REFRESH command is sent, at block 722, a REFRESH command is issued for a skipped target refresh row indicated by a stored CBR counter value. After the skipped REFRESH command(s) are issued, the DRAM memory controller 502 resets the tREFI timer and increments the column before row (CBR) counter 532 at block 724, after which control flow returns to block 706. In operation, issuing of the REFRESH command for a skipped refresh operation may be performed at a more convenient time, for example, as shown in FIG. 8.

Figure 8:
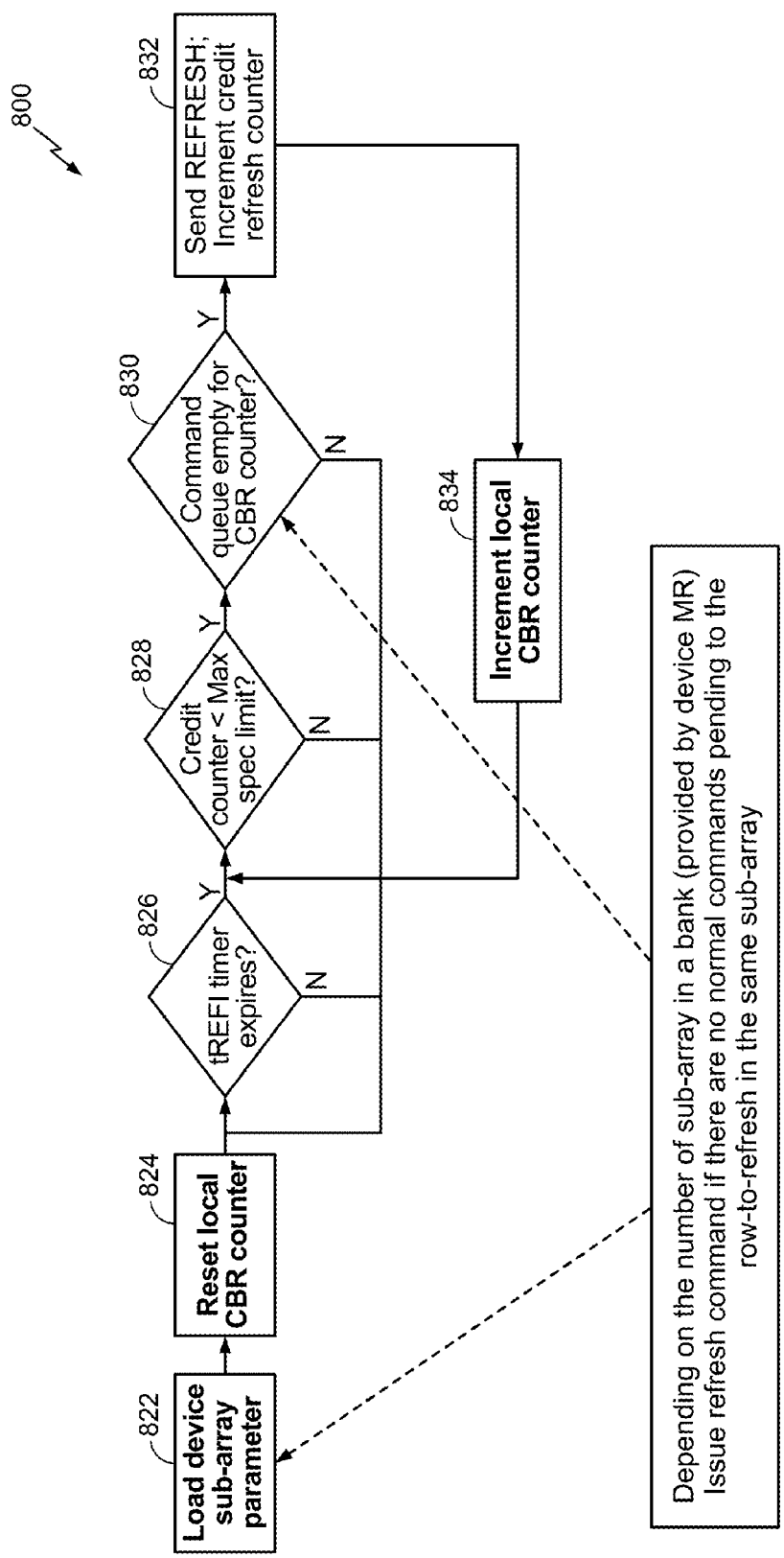
FIG. 8 is a functional block diagram illustrating functions of the DRAM memory controller of FIG. 5 according to a further aspect of the present disclosure.

FIG. 8 is a functional block diagram 800 illustrating functions of the DRAM memory controller of FIG. 5 according to a further aspect of the present disclosure. At block 822, the DRAM memory controller 502 loads device sub-array parameters (e.g., from the mode register 534). For example, the operation of blocks 822 and 830 may depend on the number of sub-arrays in a bank, which is provided by the device mode register 534. At block 824, the DRAM memory controller 502 resets the column before row (CBR) counter 532. At block 826, the DRAM memory controller 502 determines whether a tREFI timer, which corresponds to a refresh period, has expired. When the tREFI timer has expired, at block 828, it is determined whether a REFRESH command may be issued for a skipped target refresh row.

In this configuration, blocks 822 and 830 issue refresh commands if there are no normal commands pending to the row-to-refresh in the sub-array. In particular, when the tREFI timer has expired, at block 828, the DRAM memory controller 502 determines whether a credit refresh counter is less than a maximum specified limit. If the credit refresh counter is less than a maximum specified limit, at block 830, the DRAM memory controller 502 determines whether a command queue for the CBR counter 532 is empty. If the command queue of the CBR counter 532 is empty, at block 832, the DRAM memory controller 502 issues a REFRESH command for a skipped target refresh row indicated by a stored CBR counter value. In addition, the memory controller 502 increments the credit refresh counter at block 832. In addition, the memory controller 502 also increments the local CBR counter 532 at block 834. In this configuration, the refresh control logic 530 maintains information about skipped REFRESH commands. The REFRESH command may be skipped or postponed until a more convenient time, for example, when busy with normal traffic (e.g., the memory bus 512 is busy).

Figure 9:
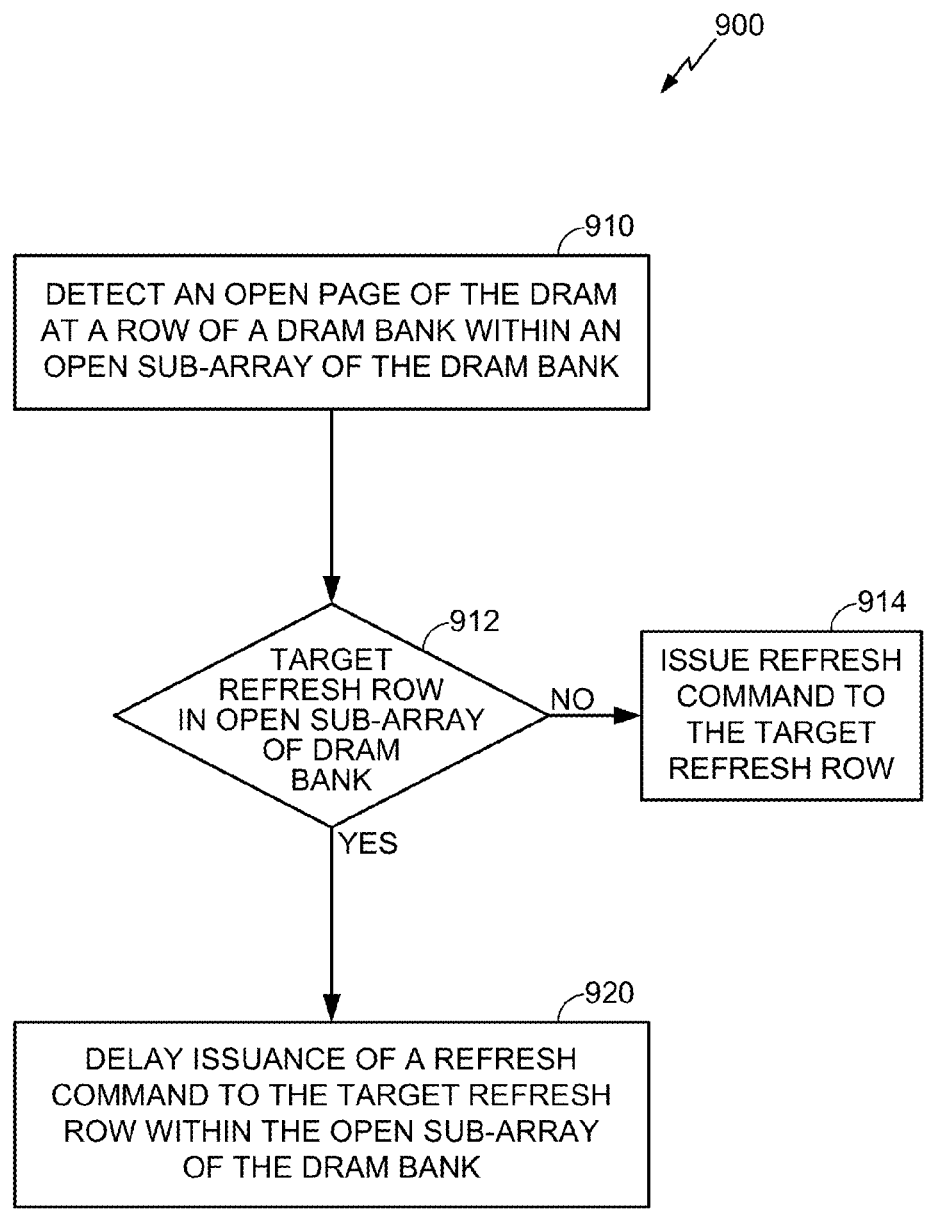
FIG. 9 is a flow chart illustrating a method for delaying issuance of a refresh operation to a target refresh rows within an open sub-array of a DRAM bank according to an aspect of the present disclosure.

FIG. 9 is a flow chart illustrating a method 900 for delaying issuance of a refresh operation to a target refresh row within an open sub-array of a DRAM bank according to an aspect of the present disclosure. At block 910, an open page of a dynamic random access memory (DRAM) is detected at a row of a DRAM bank that is within an open sub-array of the DRAM bank. For example, as shown in FIG. 1, the open page 116 is located in the open sub-array 104-7 of the bank 102-7. Because the refresh row 114 is not within the open sub-array 104-7, the open page 116 can remain open during the refresh operation. In this case, none of the banks 102 should be closed during the refresh operation.

Referring again to FIG. 9, at block 912, it is determined whether a target refresh row of the DRAM bank is within an open sub-array of the DRAM bank. For example, as shown in FIG. 1, the refresh row 114 (e.g., the target refresh row) is not within the open sub-array 104-7 of the bank 102-7. Accordingly, at block 914, a refresh command is issued to the target refresh row. A target refresh row, however, may be within the open sub-array 104-7 of the bank 102-7 that includes the open page 116 of FIG. 1. In this case, at block 920, issuance of a refresh command to the target refresh row of the DRAM bank is delayed when the target refresh row of the DRAM bank is within the open sub-array of the DRAM bank.

In one configuration, a memory controller, including a refresh controller, is coupled to a dynamic random access memory (DRAM) with a memory bus. The refresh controller includes a local column before row (CBR) counter. The refresh controller includes means for detecting an open page of the DRAM at a row of a DRAM bank within an open sub-array of the DRAM bank. In one aspect of the disclosure, the detecting means may be the refresh control logic 530 and/or the refresh controller 520 configured to perform the functions recited by the detecting means. In this configuration, the refresh controller also includes means for delaying issuance of a refresh command to a target refresh row of the DRAM bank. In one aspect of the disclosure, the delaying means may be the refresh controller 520 and/or the refresh control logic 530 configured to perform the functions recited by the delaying means. In another aspect, the aforementioned means may be any module or any apparatus configured to perform the functions recited by the aforementioned means.

Figure 10:
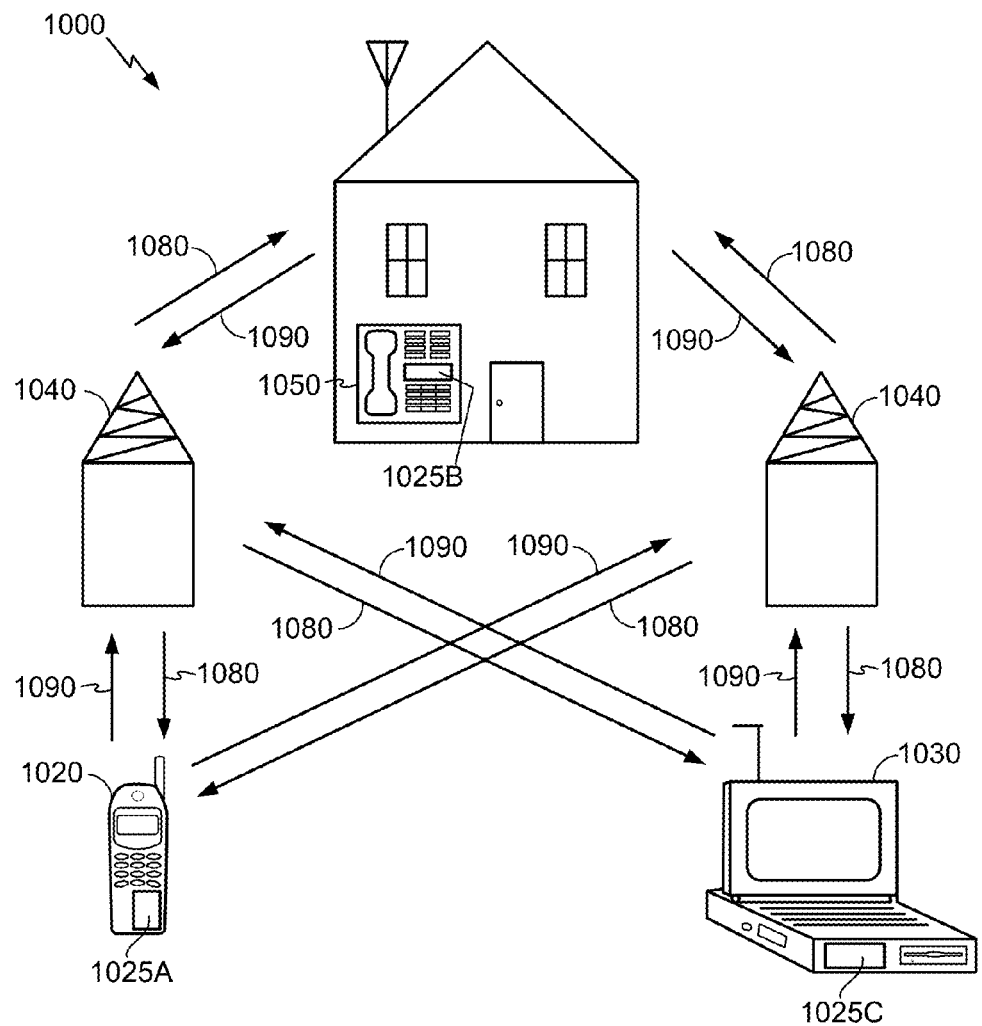
FIG. 10 is a block diagram showing an exemplary wireless communication system in which a configuration of the disclosure may be advantageously employed.

FIG. 10 shows an exemplary wireless communication system 1000 in which an aspect of the disclosure may be advantageously employed. For purposes of illustration, FIG. 10 shows three remote units 1020, 1030, and 1050 and two base stations 1040. It will be recognized that typical wireless communication systems may have many more remote units and base stations. Remote units 1020, 1030, and 1050 include memory controller circuitry 1025A, 1025B, and 1025C, respectively, which are aspects of the disclosure as discussed above. FIG. 10 shows forward link signals 1080 from the base stations 1040 and the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 10 illustrates memory controller circuitry according to the teachings of the disclosure, the disclosure is not limited to these exemplary illustrated units. For instance, memory controller circuitry according to aspects of the present disclosure may be suitably employed in any device.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. For example, although the preceding description was with respect to asserting two word lines at the same time, more than two word lines could be asserted. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of refreshing a dynamic random access memory (DRAM), comprising:
   resetting a refresh interval timer;
   detecting an open page of the DRAM at a row of a DRAM bank within an open sub-array of the DRAM bank;
   maintaining the open-sub-array of the DRAM bank by delaying issuance of a refresh command to a target refresh row of the DRAM bank when the target refresh row of the DRAM bank is within the open sub-array of the DRAM bank;
   incrementing a column before row (CBR) counter to select a new target refresh row;
   determining whether a refresh period has expired based on the refresh interval timer; and
   skipping issuance of the refresh command to a new target refresh address for the current refresh period when an open sub-array conflicts with the new target refresh row in response to determining the refresh period has expired.

2. The method of claim 1, in which delaying issuance of the refresh command further comprises skipping issuance of the refresh command to the target refresh row.

3. The method of claim 1, further comprising:
   issuing a directed refresh command to the new target refresh row when the open sub-array does not conflict with the new target refresh row in response to determining the refresh period has expired;
   incrementing the CBR counter to select a next target refresh row; and
   resetting the refresh interval timer.

4. The method of claim 1, in which delaying issuance of the refresh command further comprises:
   storing the CBR counter value of the target refresh row;
   incrementing the CBR counter to select a new target refresh row; and
   issuing the refresh command to the new target refresh row before issuing the refresh command to the target refresh row.

5. The method of claim 4, further comprising issuing the refresh command to the target refresh row when a memory bus is idle.

6. The method of claim 4, further comprising:
   determining one or more skipped target refresh rows according to each stored CBR counter value;
   detecting an idle state of a memory bus; and
   issuing refresh commands to the one or more skipped target refresh rows until the memory bus is busy.

7. The method of claim 1, further comprising integrating the DRAM into a mobile phone, a set top box, a music player, a video player, an entertainment unit, a navigation device, a computer, a hand-held personal communication systems (PCS) unit, a portable data unit, and/or a fixed location data unit.

8. The method of claim 1, further comprising issuing the refresh command to the target refresh row of the DRAM bank before closing the open page of the DRAM bank when the target refresh row of the DRAM bank is within a closed sub-array of the DRAM bank.

9. A memory controller, comprising:
   a dynamic random access memory (DRAM); and
   a refresh controller coupled to the DRAM with a memory bus, the refresh controller including a column before row (CBR) counter and control logic, the control logic operable:
   to reset a refresh interval timer;
   to detect an open page of the DRAM at a row of a DRAM bank within an open sub-array of the DRAM bank according to a value of the CBR counter;
   to maintain the open sub-array of the DRAM bank by delaying issuance of a refresh command to a target refresh row of the DRAM bank when the target refresh row of the DRAM bank is within the open sub-array of the DRAM bank;
   to increment the CBR counter to select a new target refresh row;
   to determine whether a refresh period has expired based on the refresh interval timer; and
   to skip issuance of the refresh command to a new target refresh address for the current refresh period when an open sub-array conflicts with the new target refresh row in response to determining the refresh period has expired.

10. The memory controller of claim 9, in which the control logic is further operable to skip issuance of the refresh command to the target refresh row.

11. The memory controller of claim 10, in which the control logic is further operable to issue a directed refresh command to a new target refresh row when the open sub-array does not conflict with the new target refresh row in response to determining that a refresh period has expired.

12. The memory controller of claim 9, in which the control logic is further operable to issue refresh commands to skipped target refresh rows when the memory bus is idle.

13. The memory controller of claim 9, integrated in a mobile phone, a set top box, a music player, a video player, an entertainment unit, a navigation device, a computer, a hand-held personal communication systems (PCS) unit, a portable data unit and/or a fixed location data unit.

14. The memory controller of claim 9, in which the control logic is further operable to issue the refresh command to the target refresh row of the DRAM bank before closing the open page of the DRAM bank when the target refresh row of the DRAM bank is within a closed sub-array of the DRAM bank.

15. A memory controller, comprising:
   a dynamic random access memory (DRAM); and
   a refresh controller coupled to the dynamic random access memory, the refresh controller including a column before row (CBR) counter, the refresh controller comprising:
   means for resetting a refresh interval timer;
   means for detecting an open page of the DRAM at a row of a DRAM bank within an open sub-array of the DRAM bank according to a value of the CBR counter;
   means for maintaining the open sub-array of the DRAM bank by delaying issuance of a refresh command to a target refresh row of the DRAM bank when the target refresh row of the DRAM bank is within the open sub-array of the DRAM bank;
   means for incrementing the CBR counter to select a new target refresh row;
   means for determining whether a refresh period has expired based on the refresh interval timer; and
   means for skipping issuance of the refresh command to a new target refresh address for the current refresh period when an open sub-array conflicts with the new target refresh row in response to means for determining the refresh period has expired.

16. The memory controller of claim 15, integrated in a mobile phone, a set top box, a music player, a video player, an entertainment unit, a navigation device, a computer, a hand-held personal communication systems (PCS) unit, a portable data unit and/or a fixed location data unit.

17. The memory controller of claim 15, further comprising means for issuing the refresh command to the target refresh row of the DRAM bank before closing the open page of the DRAM bank when the target refresh row of the DRAM bank is within a closed sub-array of the DRAM bank.

18. A method of refreshing a dynamic random access memory (DRAM), comprising:
the step of resetting a refresh interval timer;
the step of detecting an open page of the DRAM at an open row of a DRAM bank within an open sub-array of the DRAM bank;
the step of maintaining the open sub-array of the DRAM bank by delaying issuance of a refresh command to a target refresh row of the DRAM bank when the target refresh row of the DRAM bank is within the open sub-array of the DRAM bank;
the step of incrementing a column before row (CBR) counter to select a new target refresh row;
the step of determining whether a refresh period has expired based on the refresh interval timer; and
the step of skipping issuance of the refresh command to a new target refresh address for the current refresh period when an open sub-array conflicts with the new target refresh row in response to determining the refresh period has expired.

19. The method of claim 18, further comprising:
the step of skipping issuance of the refresh command to the target refresh row; or
the step of issuing the refresh command to the target refresh row when a memory bus is idle.

20. The method of claim 18, further comprising integrating the DRAM into a mobile phone, a set top box, a music player, a video player, an entertainment unit, a navigation device, a computer, a hand-held personal communication systems (PCS) unit, a portable data unit and/or a fixed location data unit.

21. The method of claim 18, further comprising the step of issuing the refresh command to the target refresh row of the DRAM bank before closing the open page of the DRAM bank when the target refresh row of the DRAM bank is within a closed sub-array of the DRAM bank.

* * * * *